US006808974B2

United States Patent
Park et al.

(10) Patent No.: US 6,808,974 B2
(45) Date of Patent: Oct. 26, 2004

(54) CMOS STRUCTURE WITH MAXIMIZED POLYSILICON GATE ACTIVATION AND A METHOD FOR SELECTIVELY MAXIMIZING DOPING ACTIVATION IN GATE, EXTENSION, AND SOURCE/DRAIN REGIONS

(75) Inventors: Heemyong Park, LaGrangeville, NY (US); Dominic J. Schepis, Wappingers Falls, NY (US); Fariborz Assaderaghi, San Diego, CA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/859,021

(22) Filed: May 15, 2001

(65) Prior Publication Data
US 2002/0173105 A1 Nov. 21, 2002

(51) Int. Cl.[7] .......................................... H01L 21/8238
(52) U.S. Cl. ...................... 438/232; 438/306
(58) Field of Search ............... 438/230, 229, 438/231, 232, 306, 305

(56) References Cited

U.S. PATENT DOCUMENTS

| 4,703,551 | A | | 11/1987 | Szluk et al. | |
| 5,290,717 | A | | 3/1994 | Shimazu | |
| 5,576,579 | A | | 11/1996 | Agnello et al. | |
| 5,789,802 | A | * | 8/1998 | Tripsas | 257/607 |
| 5,970,354 | A | | 10/1999 | Mark et al. | |
| 5,976,925 | A | * | 11/1999 | Cheek et al. | 438/231 |
| 6,001,677 | A | * | 12/1999 | Shimizu | 438/231 |
| 6,060,364 | A | | 5/2000 | Maszara et al. | |
| 6,080,629 | A | | 6/2000 | Gardner et al. | |
| 6,124,187 | A | | 9/2000 | Tsukamoto | |
| 6,333,249 | B2 | * | 12/2001 | Kim et al. | 438/592 |

FOREIGN PATENT DOCUMENTS

| JP | 57180173 A | 11/1982 |
| JP | 6053507 A | 2/1994 |
| WO | WO 97/36321 | 10/1997 |

OTHER PUBLICATIONS

European Search Report dated Jul. 25, 2002.

* cited by examiner

*Primary Examiner*—John F. Niebling
*Assistant Examiner*—Christopher Lattin
(74) *Attorney, Agent, or Firm*—McGuireWoods LLP; Joseph P. Abate

(57) ABSTRACT

A method is provided for maximizing activation of a gate electrode while preventing source and drain regions from being excessively doped. The gate electrode is partially doped when exposed the source/drain implantation step. Then, the gate electrode is fully doped by the selective implantation step while the source/drain regions are blocked. Separate annealing steps are provided subsequent to the gate doping step and the source and drain implantation step.

21 Claims, 2 Drawing Sheets

CMOS STRUCTURE WITH MAXIMIZED POLYSILICON GATE ACTIVATION AND A METHOD FOR SELECTIVELY MAXIMIZING DOPING ACTIVATION IN GATE, EXTENSION, AND SOURCE/DRAIN REGIONS

BACKGROUND OF THE INVENTION

1. Field of the Invention

The present invention generally relates to a semiconductor device, more particularly to a complementary metal oxide (CMOS) silicon field effect transistor (FET) having a polysilicon gate electrode with a sub-0.1 $\mu$m gate length scale.

2. Background Description

The escalating requirements for high density and performance associated with ultra large scale integration semiconductor devices involves submicron device features, high reliability and increased manufacturing throughput.

Conventional practices are primarily based upon a polysilicon gate CMOS process, in which source and drain regions are formed by implanting impurity atoms in the substrate by using a polysilicon gate electrode as a mask. This has an advantage of doping the polysilicon gate simultaneously when source and drain regions are formed by ion implantation at the same implantation dose. Subsequently, annealing is performed to activate the implanted impurity atoms and also to diffuse the impurity atoms implanted into the polysilicon gate throughout the gate to reach the interface with the gate oxide.

The level of dopant activation in a polysilicon gate is determined by solid solubility of the dopant and the chemical dopant concentration in the polysilicon gate. To maximize dopant activation in a polysilicon gate, the chemical dopant concentration is ideally required to be as high as the dopant solid solubility at the annealing temperature. Here, since the polysilicon gate is doped at the same implantation dose energy with the source and drain regions, the implantation dose and energy for the source and drain regions strictly limit the dopant concentration and the maximum activation level of the polysilicon gate.

In general, diffusion proceeds proportionally to the impurity concentration gradient. Therefore, for devices having a gate length smaller than 0.1 $\mu$m, excessively high concentration doping for the source and drain regions causes excessive lateral diffusion of the dopants (e.g., boron, phosphorous) into the channel region. Thus, the dopant concentration of the source and drain regions must be strictly limited below a certain level, and, thus, can not be compromised by increasing the chemical dopant concentration of the polysilicon gate to ideal levels.

This causes insufficient impurity concentration for the polysilicon gate, insufficient activation of a polysilicon gate, and eventually a gate depletion problem when a bias current is applied to the gate to turn on the MOSFET device. This in turn results degradation of the device performance, such as reduction of the output current due to the increased effective gate dielectric thickness.

Additionally, in order to effectively activate source/drain extensions and source/drain regions formed by deep source/drain doping, the thermal cycle for annealing is required to be performed at a high temperature to increase the activation, but must be performed as quickly as possible to avoid excessive dopant redistribution. However, such a short thermal cycle during the annealing step is not sufficient to fully activate the implanted dopants in the polysilicon gate.

Furthermore, the grain size in the polysilicon varies depending on the dopant types and thermal processing sequences. For a P-type MOSFET, boron implanted in the polysilicon gate should not penetrate into the gate oxide while boron diffusion needs to be sufficient to achieve a fully activated P-type gate electrode. Therefore, to fully activate a gate electrode, a precisely calibrated annealing step with a specific temperature and thermal cycle is required depending on the type of the dopant in the polysilicon gate. Also, the optimal thermal cycles for activating a P-type MOSFET is very often significantly different from that of an N-type MOSFET. Thus, if an annealing step is performed to activate source/drain regions only, the gate electrode may not be fully activated.

As a possible alternative, a metal gate has been introduced, but it has been found that it is difficult and costly to achieve a proper work function difference between an N-type MOS transistor and a P-type MOS transistor. Therefore, a metal gate is not considered to be a suitable or successful solution to obtain optimal transistor performance consistent with manufacturing economy.

SUMMARY OF THE INVENTION

An advantage of the present invention is to achieve maximized polysilicon gate activation while preventing source/drain regions from being doped at an excessively high impurity concentration, and thereby avoiding lateral encroachment of the dopant into the channel. Another advantage of the present invention is to provide a production-worthy manufacturing method for maximization of gate electrode activation without significant modification of the processing steps and equipments. A further advantage of the present invention is to provide a precisely calibrated annealing step with an optimal temperature and thermal cycle depending on the dopant type implanted in the gate electrode. Furthermore, the present invention provides various manufacturing sequences to achieve the maximum gate electrode activation.

Additional advantages and other features of the present invention will be set forth in part in the description which follows and will become apparent to those having ordinary skill in the art upon examination of the following or may be learned from the practice of the present invention. The objects and advantages of the present invention may be realized and obtained as particularly pointed out in the appended claims.

According to the present invention, the foregoing and other advantages are achieved in part by a method for manufacturing a semiconductor device, comprising the step of forming source/drain regions of a first conductivity type in a main surface of a semiconductor substrate, and selectively doping a gate electrode formed on said main surface, so that said gate electrode has an impurity concentration of said first conductivity type higher than that of said source/drain regions.

According to certain embodiments of the present invention, the gate electrode is fully doped by two steps. First, the gate electrode is partially doped by a separate ion implantation step while the source/drain regions are masked. Then, the gate electrode is fully doped when the source/drain regions are formed by ion implantation.

Thus, according to the present invention, the gate electrode is doped at an optimized impurity implantation concentration, independently from the impurity implantation for the source/drain regions. Accordingly, the present invention enables maximization of the gate electrode activation while preventing the source/drain regions from being doped at an excessively high impurity concentration.

Additional advantages of the present invention will become readily apparent to those skilled in this art from the following detailed description, wherein only the preferred embodiment of the present invention is shown and described, simply by way of illustration of the best mode contemplated for carrying out the present invention. As will be realized, the present invention is capable of other and different embodiments and its several details are capable of modifications in various obvious respects, all without departing from the present invention. Accordingly, the drawings and description are to be regarded as illustrative in nature, and not restrictive.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

The present invention enables maximization of the activation of a gate electrode by separating the gate electrode doping step from the source/drain implantation step. By separating these steps, it is possible to increase the chemical impurity concentration of a gate electrode to a level approximately as high as the dopant solid solubility in the gate electrode at an annealing temperature, thereby maximizing the polysilicon gate dopant activation. Also, since the impurity concentration can be controlled independently from the gate doping step, the present invention enables avoidance of excessive lateral diffusion of the dopants. Further, by separating the annealing step for the gate electrode from that of the source/drain, the present invention achieves maximized gate activation.

According to the present invention, maximum gate activation is achieved by exposing a gate electrode to the source/drain implantation so as to partially dope the gate electrode, and by further selectively doping the gate electrode to increase the impurity concentration of the gate electrode to a desired level while the source/drain regions are masked.

Figure 1:
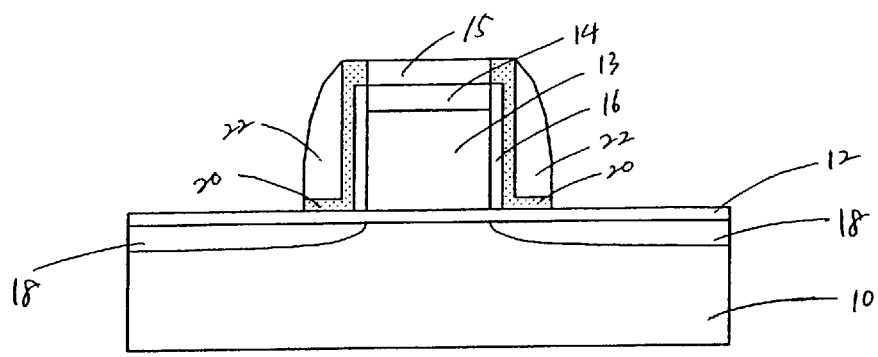
FIGS. 1 to 4 illustrate sequential phases of a method according to the first embodiment of the present invention.

With this in mind, referring now to the drawings, FIGS. 1–4 depict a method for manufacturing such device according to the first embodiment of the present invention. In FIG. 1, there is shown a sectional view of a semiconductor device, in which a gate electrode 13 is formed on a semiconductor substrate 10 with a gate oxide layer 12 therebetween. On the upper surface of the gate electrode 13, an oxide cap layer 14, a nitride cap layer 15 are formed. On the side surfaces of the gate electrode 13, oxide sidewalls 17, a nitride liner 20 and sidewall spacers 22 are formed.

As conventionally well known, this gate structure can be formed by sequentially depositing a polysilicon layer, an oxide layer (e.g., TEOS) and a nitride layer on the gate oxide layer 12. The layers are etched by conventional lithographic and etching techniques (e.g., reactive ion etching) to shape the gate electrode 13. Preferably, these layers are patterned to form the gate electrode 13 having a gate length smaller than about 0.1 μm. The oxide cap layer 14 and the nitride cap layer 15 are formed to protect the gate electrode 13 from a subsequent planarization process, which will be described hereafter.

Subsequently, a gate reoxidation process is performed to form the oxide sidewalls 16 to protect the gate electrode 13 from a subsequent processing step, which will be also described hereafter. Nitride and oxide layers are deposited over the entire surface of the substrate 10, the oxide sidewall 16 and the nitride cap layer 15. Then, anisotropic etching is performed to shape the sidewall spacers 22 and the nitride liner 20 by conventional lithographic and etching techniques (e.g., reactive ion etching).

During the etching step, the portion of the nitride liner 20 overlying the nitride cap layer 15 is removed, thereby exposing the nitride cap layer 15. Also, the portions of the nitride layer 20 not covered by the sidewall spacers 22 are removed, thereby exposing the portions of the gate oxide layer 12 adjoining the sidewall spacers 22. FIG. 1A further depicts source/drain extensions 18 formed in the portions of the substrate 10 adjacent to the gate electrode 13.

Figure 2:
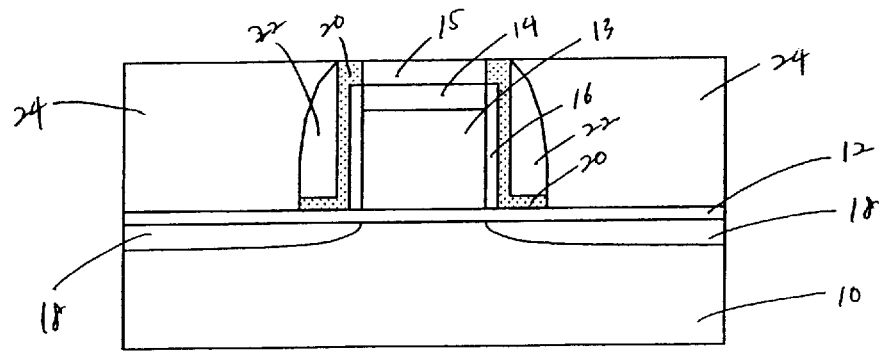

FIG. 2 depicts a mask layer 24 formed over the substrate 10 to selectively expose the nitride cap layer 16 while the portions of the substrate 10 adjoining the gate structure 11 is masked. The mask layer 24 is formed by depositing a mask material, such as, for example, TEOS, nitride, ARC, photoresist, etc., over the entire surface of the substrate 10 including the gate structure 11, the nitride liner 20 and the spacer 22.

Then, the mask layer 24 is planarized preferably by chemical mechanical polishing (CMP) until the portion of the mask material overlying the nitride cap layer 16 is removed. The nitride cap layer 15 and the oxide cap layer 14 secure the gate electrode 13 from the mask layer planarization process so that the gate electrode 13 is not affected by possible over-etching of the mask layer 24.

Figure 3:
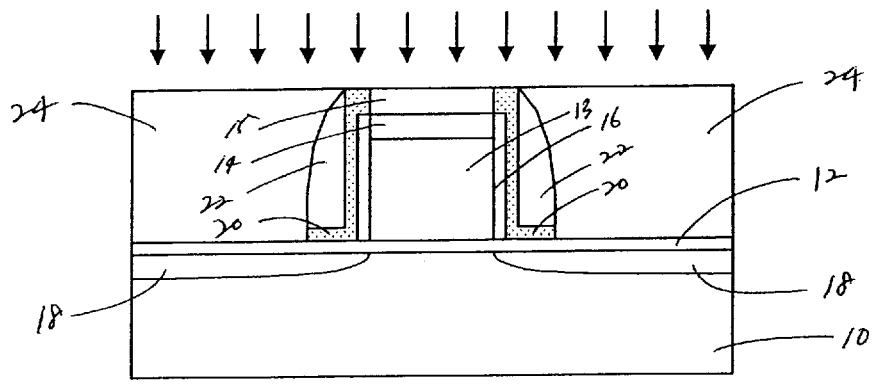

FIG. 3 depicts a gate doping step, in which impurity atoms are implanted to partially dope the gate electrode 13. The gate electrode 13 is doped by implanting impurity atoms, such as, for examples, an N-type dopant, e.g., phosphorus, arsenic, or a P-type dopant, e.g., boron, as shown as the arrows in FIG. 3, into the gate electrode 13 via the nitride cap layer 15 and the oxide cap layer 14.

The impurity implantation concentration and the implantation energy of the impurity atoms are predetermined so that when the subsequent source/drain implantation is performed, the gate electrode 13 is doped at the impurity level sufficient for the maximum activation. According to this embodiment of the present invention, the impurity atoms are implanted at an impurity implantation dose between about $1 \times 10^{15}$ atoms/cm$^2$ and about $2 \times 10^{16}$ atoms/cm$^2$ at an implantation energy between about 5 keV and about 20 keV.

Alternatively, the impurity atoms can be implanted by multiple implantation, for example, by implanting atoms at an impurity implantation dose between about $1 \times 10^{15}$ atoms/cm$^2$ and about $2 \times 10^{16}$ atoms/cm$^2$ at an implantation energy between about 5 keV and about 20 keV, and repeating said implantation step.

Subsequently, an annealing step is performed to activate the impurity atoms implanted in the gate electrode 13, for example, by rapid thermal annealing (RTA) at a temperature of between about 900° C. and about 1100° C. for about 1 seconds to about 20 seconds.

Figure 4:
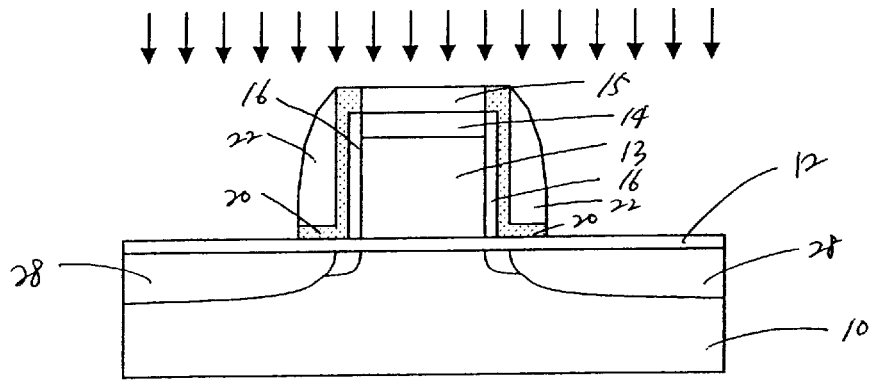

After removing the mask 24, as depicted in FIG. 4, impurity atoms are implanted on the substrate 10 to form the source and drain regions 28 having an impurity concentration sufficient to avoid the excessive lateral diffusion, and, at the same time, to further dope the gate electrode 13 to increase the chemical impurity concentration up to the level sufficient for the maximum activation. The impurity atoms are implanted at an impurity implantation dose between about $1 \times 10^{15}$ atoms/cm$^2$ and about $5 \times 10^{15}$ atoms/cm$^2$ at an implantation energy between about 5 keV and about 20 keV.

Subsequently, an annealing step is performed to activate the source and drain regions 28 and the gate electrode 13.

For example, the annealing step is performed by rapid thermal annealing (RTA) at a temperature of between about 900° C. and about 1100° C. for about 1 seconds to about 20 seconds.

Alternatively, it is possible to perform the annealing step only once after forming the source and drain regions 20, thereby eliminating the first annealing step after doping the gate electrode 13.

Thus, the present invention enables maximization of the gate electrode activation while avoiding the excessive lateral diffusion of the impurity atoms in the source and drain regions. Also, the present invention can be performed by conventional semiconductor manufacturing techniques, and, therefore, can be easily incorporated into any manufacturing process.

FIGS. 5 to 8 depict manufacturing steps according to the second embodiment of the present invention. The method according to this embodiment involves a slightly different process sequence from the previous embodiment. Thus, the present invention can be implemented in various ways, as readily conceivable from the exemplary embodiments shown herein, and is not limited to certain processing sequences shown herein.

According to the second embodiment, gate doping is performed by two steps. First, the gate electrode is doped during the source/drain implantation step at the impurity concentration predetermined for the source/drain formation and activation, which is not sufficient for the maximum gate activation. To compensate the deficiency in the impurity concentration for the maximum activation, the gate electrode is further selectively doped to increase the chemical impurity concentration while the source/drain regions are blocked from the further impurity implantation.

Figure 5:
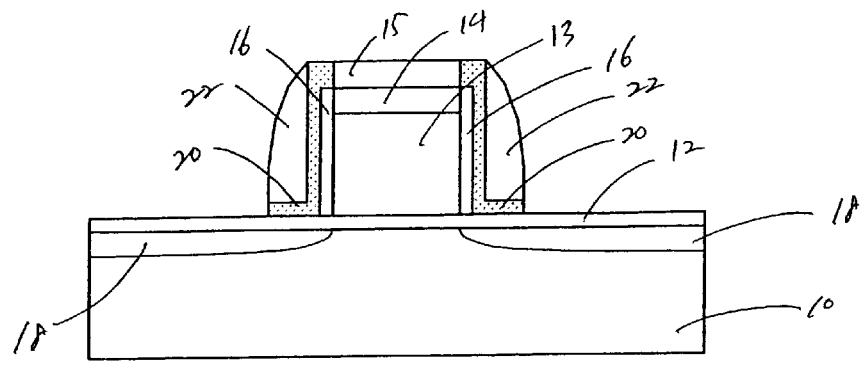
FIGS. 5 to 8 illustrate sequential phases of a method according to the second embodiment of the present invention, wherein, in FIGS. 1 to 8, similar features are denoted by similar reference numerals.

With this in mind, FIG. 5 depicts a gate structure, which is the same with the gate structure of FIG. 1, formed on the substrate 10 with a gate oxide 12 therebetween. The materials and their processing methods mentioned in this embodiment are either described in the description for the first embodiment or conventionally well-known, and will not be repeated hereafter.

Figure 6:
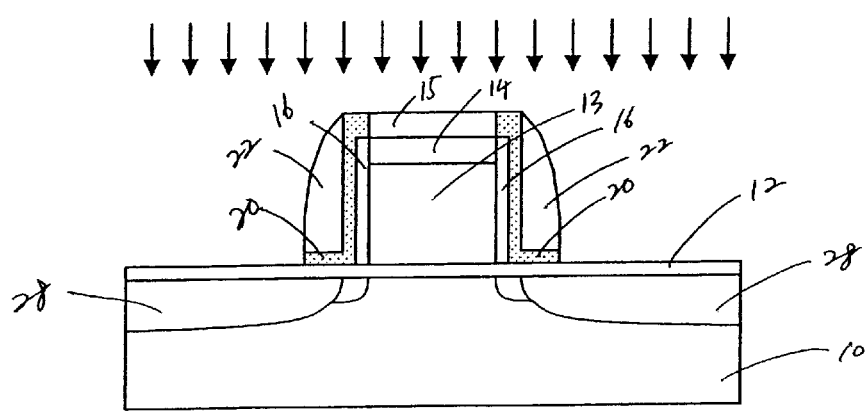

As shown in FIG. 6, impurity atoms are implanted on the main surface of the substrate 10 to form the source and drain regions 28 and, at the same time, on the gate electrode 13 to dope the gate electrode 13. Thus, the gate electrode 13 is doped at the impurity concentration sufficient for the source and drain regions 28 to avoid the excessive lateral dopant diffusion during the subsequent annealing step.

The impurity dopants are implanted at an impurity implantation dose between about $1 \times 10^{15}$ atoms/cm$^2$ and about $5 \times 10^{15}$ atoms/cm$^2$ at an implantation energy between about 5 keV and about 20 keV, to form the source and drain regions 28 and to dope the gate electrode 13.

Subsequently, an annealing step is performed to activate the implanted impurity atoms in the source and drain regions 28. Since the gate electrode 13 is doped at an insufficient impurity concentration, the annealing step does not fully activate the gate electrode to the maximum level. The annealing step is performed by rapid thermal annealing (RTA) at a temperature of between about 900° C. and about 1100° C. for about 1 seconds to about 20 seconds.

To achieve the maximum activation, it is required to increase the chemical impurity concentration of the gate electrode 13 up to the level as high as the solid solubility of the impurity implanted in the gate electrode 14.

Figure 7:
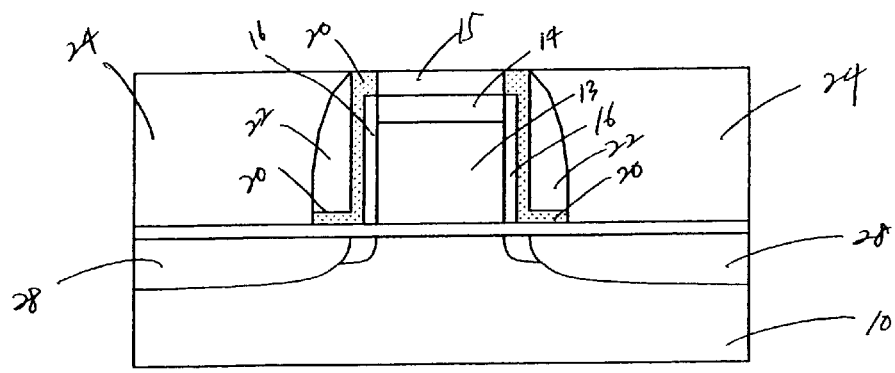
Figure 8:
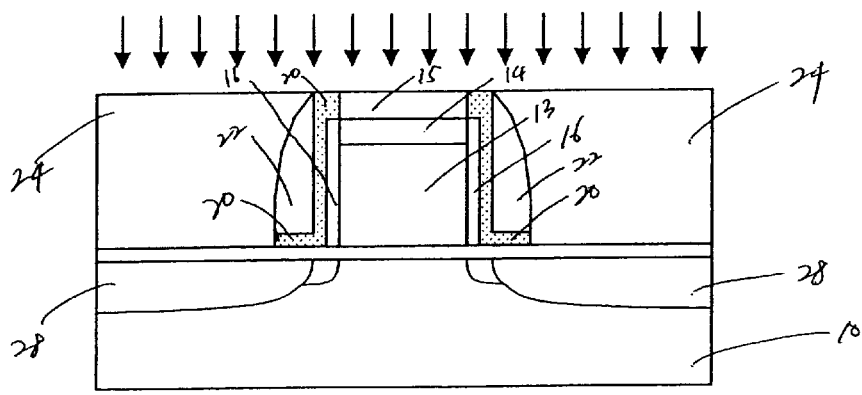

As shown in FIG. 7, a mask layer 24 is formed to block the source/drain regions 28. Then, as shown in FIG. 8, impurity atoms are selectively implanted on the gate electrode 13, while the source and drain regions 28 are blocked by the mask 24.

The impurity atoms are implanted on the upper surface of the gate electrode 13 at an impurity implantation dose between about $1 \times 10^{15}$ atoms/cm$^2$ and about $2 \times 10^{16}$ atoms/cm$^2$ at an implantation energy between about 5 keV and about 20 keV. Alternatively, the impurity atoms can be implanted by multiple implantation, for example, by implanting at an impurity implantation dose between about $1 \times 10^{15}$ atoms/cm$^2$ and about $2 \times 10^{16}$ atoms/cm$^2$ at an implantation energy between about 5 keV and about 20 keV, and repeating said implantation step.

Subsequently, an annealing step is performed, for example, by rapid thermal annealing (RTA) at a temperature of between about 900° C. and about 1100° C. for about 1 second to about 20 seconds, to maximize the activation of the gate electrode 13.

Alternatively, according to the present invention, it is possible to perform the annealing step only once after implanting the impurity atoms to selectively dope the gate electrode 13, thereby reducing the processing steps.

Accordingly, the present invention enables to maximize the gate electrode activation while still avoiding the excessive lateral diffusion of the impurity atoms in the source and drain regions, without significant modification of the existing manufacturing sequences.

Also, according to the present invention, two different gate electrodes can be formed at its optimum impurity concentration and precisely calibrated annealing temperature by conventional masking techniques. For example, it is possible to form an N-type MOSFET by doping its gate electrode with phosphorus at the optimum impurity concentration and annealing temperature precisely calibrated for phosphorus while a P-type MOSFET are masked. Upon completing the gate doping step for the N-type MOSFET, the gate of the P-type MOSFET is doped by implanting boron at the optimum impurity concentration and annealing temperature precisely calibrated for boron. Therefore, the present invention enables an optimum impurity concentration and a precisely calibrated annealing step with a specific temperature and thermal cycle for both of a P-type MOSFET and an N-type MOSFET.

While the invention has been described in terms of four preferred embodiments, those skilled in the art will recognize that the invention can be practiced with modification within the spirit and scope of the appended claims.

Having thus described our invention, what we claim as new and desire to secure by Letters Patent is as follows:

1. A method for manufacturing a semiconductor device, comprising the sequential steps of:
   forming a gate electrode on a main surface of a semiconductor substrate with a gate oxide therebetween exposing an area for forming source/drain regions;
   performing a first implantation step to form said source/drain regions in portions of the main surface adjacent to said gate electrode and to partially dope said gate electrode; and
   performing a second implantation step to fully dope said gate electrode selectively to said source/drain regions such that said gate electrode has an impurity concentration greater than that of said source/drain regions.

2. The method of claim 1, comprising the sequential steps of:
   performing said first implantation step to form said source/drain regions in said portions of the substrate and to partially dope said gate electrode;
   forming a mask on said main surface to selectively expose said gate electrode after said first implantation step; and
   performing said second implantation step to fully dope said gate electrode selectively to said source/drain regions.

3. The method of claim 2, the mask is selected from a group consisting of TEOS, nitride, ARC and photoresist.

4. The method of claim 1, further comprising the step of annealing to activate said source/drain regions and said gate electrode.

5. The method of claim 4, said annealing step comprising the sequential steps of:
a first annealing step to activate said source/drain regions and to partially activate said gate electrode; and
a second annealing step to fully activate said gate electrode.

6. The method of claim 5, wherein said first and second annealing steps are performed at a temperature of between about 900° C. and about 1100° C. for about 1 seconds to about 20 seconds.

7. The method of claim 4, said first implantation step is performed by implanting impurity atoms at an impurity implantation dose between about $1 \times 10^{15}$ atoms/cm$^2$ and about $5 \times 10^{15}$ atoms/cm$^2$ at an implantation energy between about 5 keV and about 20 keV.

8. The method of claim 4, said second implantation step is performed by implanting impurity atones at an impurity implantation dose between about $1 \times 10^{15}$ atoms/cm$^2$ and about $2 \times 10^{16}$ atoms/cm$^2$ at an implantation energy between about 5 keV and about 20 keV.

9. A method for manufacturing a semiconductor device, comprising the sequential steps of:
forming a gate electrode on a main surface of a semiconductor substrate with a gate oxide therebetween exposing an area for forming source/drain regions;
performing a first implantation step to partially dope said gate electrode selectively; and
performing a second implantation step to fully dope said gate electrode and to form said source/drain regions in portions of the main surface adjacent to said gate electrode such that said gate electrode has an impurity concentration higher than that of said source/drain regions.

10. The method of claim 9, comprising the sequential steps of:
forming a mask on said main surface to selectively expose said gate electrode;
performing said first implantation step to partially dope said gate electrode selectively to said portions of the substrate;
removing said mask; and
performing a second implantation step to fully dope said gate electrode and to form said source/drain regions in said portions of the substrate.

11. The method of claim 10, the mask is selected from a group consisting of TEOS, nitride, ARC and photoresist.

12. The method of claim 9, further comprising the step of annealing to activate said source/drain regions and said gate electrode.

13. The method of claim 12, said annealing step comprising the sequential steps of:
a first annealing step to partially activate said gate electrode; and
a second annealing step to activate said source/drain regions and to fully activate said gate electrode.

14. The method of claim 13, wherein said first and second annealing steps are performed at a temperature of between about 900° C. and about 1100° C. for about 1 second to about 20 seconds.

15. The method of claim 9, said first implantation step is performed by implanting impurity atoms at an impurity implantation dose between about $1 \times 10^{15}$ atoms/cm$^2$ and about $2 \times 10^{16}$ atoms/cm$^2$ at an implantation energy between about 5 keV and about 20 keV.

16. The method of claim 9, said second implantation step is performed by implanting impurity atoms at an impurity implantation dose between about $1 \times 10^{15}$ atoms/cm$^2$ and about $5 \times 10^{15}$ atoms/cm$^2$ at an implantation energy between about 5 keV and about 20 keV.

17. The method of claim 1, wherein said gate electrode is controllably doped depending on a conductivity type of the gate electrode and dopant atoms used for doping the gate electrode.

18. The method of claim 1, the step for forming the gate electrode comprising the steps of:
depositing a polysilicon layer on the gate oxide;
depositing a gate protection layer on the polysilicon layer;
etching the polysilicon layer and the gate protection material to form the gate electrode and a gate protection layer;
forming a nitride liner over the entire surface of the substrate to cover side surfaces of the gate electrode and an upper surface of the gate protection layer; and
etching the nitride liner to expose the upper surface of the gate protection layer and the portions of the main surface adjacent to the gate electrode.

19. The method of claim 18, the step of forming the gate protection layer comprising the steps of:
depositing an oxide layer on the polysilicon layer; and
depositing a nitride layer on the oxide layer.

20. A method for manufacturing a semiconductor device, comprising the steps of:
forming a gate electrode on a main surface of a semiconductor substrate with a gate oxide therebetween;
masking source/drain regions adjacent to the said formed gate electrode with a masking material;
performing a first implantation step to partially dope said gate electrode without affecting the source/drain regions;
removing the said masking material; and
performing a second implantation step to fully dope said gate electrode and to form said source/drain regions in portions of the main surface adjacent to said gate electrode such that said gate electrode has an impurity concentration higher than that of said source/drain regions.

21. The method of claim 20, further comprising the step of forming extension regions on sides of the gate electrode prior to the masking step.

* * * * *